US011462272B2

(12) United States Patent
Choi et al.

(10) Patent No.: US 11,462,272 B2
(45) Date of Patent: Oct. 4, 2022

(54) MEMORY DEVICE AND OPERATING METHOD THEREOF

(71) Applicant: SK hynix Inc., Icheon-si (KR)

(72) Inventors: Hyung Jin Choi, Icheon-si (KR); Jae Hyeon Shin, Icheon-si (KR); In Gon Yang, Icheon-si (KR); Sungmook Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/314,913

(22) Filed: May 7, 2021

(65) Prior Publication Data

US 2022/0139461 A1 May 5, 2022

(30) Foreign Application Priority Data

Nov. 5, 2020 (KR) .................. 10-2020-0146924

(51) Int. Cl.
*G11C 16/10* (2006.01)
*G11C 16/04* (2006.01)
*G11C 16/24* (2006.01)
*G11C 16/08* (2006.01)
*G11C 16/30* (2006.01)

(52) U.S. Cl.
CPC .......... *G11C 16/10* (2013.01); *G11C 16/0483* (2013.01); *G11C 16/08* (2013.01); *G11C 16/24* (2013.01); *G11C 16/30* (2013.01)

(58) Field of Classification Search
CPC ..................................................... G11C 16/10
See application file for complete search history.

(56) References Cited

U.S. PATENT DOCUMENTS

2015/0262700 A1* 9/2015 Yoon ............... G11C 16/10
365/185.03

FOREIGN PATENT DOCUMENTS

KR 1020160069354 A 6/2016
KR 1020210096490 A 8/2021

* cited by examiner

*Primary Examiner* — Jason Lappas
(74) *Attorney, Agent, or Firm* — William Park & Associates Ltd.

(57) ABSTRACT

There are provided a memory device and an operating method thereof. The memory device includes: a memory block including a plurality of memory cells and a plurality of select transistors; a peripheral circuit for performing a program operation on selected select transistors among the plurality of select transistors in a select transistor program operation; and a control logic for controlling the peripheral circuit to perform the select transistor program operation. The peripheral circuit applies a coupling voltage having a positive potential to a source line of the memory block in the select transistor program operation.

20 Claims, 8 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0146924, filed on Nov. 5, 2020, in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

The paradigm on recent computer environment has been turned into a ubiquitous computing environment in which computing systems may be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like.

The memory device is generally classified into a volatile memory device and a nonvolatile memory device.

The nonvolatile memory device has relatively slow write and read speeds, but retains stored data even when the supply of power is interrupted. Thus, regardless of whether power is supplied, the nonvolatile memory device is used to store data to be retained. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

SUMMARY

Embodiments may provide a memory device capable of improving a threshold voltage distribution of a select transistor of the memory device in a program operation of the select transistor, and an operation method of the memory device.

In accordance with an aspect of the present disclosure, there is provided a memory device including: a memory block that includes a plurality of memory cells and a plurality of select transistors; a peripheral circuit that is configured to perform a program operation on selected select transistors among the plurality of select transistors in a select transistor program operation; and a control logic that is configured to control the peripheral circuit to perform the select transistor program operation, wherein the peripheral circuit applies a coupling voltage having a positive potential to a source line of the memory block in the select transistor program operation.

In accordance with another aspect of the present disclosure, there is provided a memory device including: a memory block that includes a plurality of memory cells and a plurality of drain select transistors; a peripheral circuit that is configured to perform a program operation on selected drain select transistors among the plurality of drain select transistors in a select transistor program operation; and a control logic that is configured to control the peripheral circuit to perform the select transistor program operation, wherein the peripheral circuit applies a coupling voltage having a positive potential to a source line of the memory block in the select transistor program operation, and wherein a potential level of second bit lines connected to unselected drain select transistors among the plurality of drain select transistors is increased due to a coupling phenomenon caused by the coupling voltage.

In accordance with still another aspect of the present disclosure, a method for operating a memory device includes: applying a program allow voltage to first bit lines connected to selected drain select transistors on which a program operation is to be performed among a plurality of drain select transistors connected to a selected drain select line, and applying a first program inhibit voltage to second bit lines connected to unselected drain select transistors among the plurality of drain select transistors; applying a coupling voltage having a potential higher than that of the first program inhibit voltage to a source line; and programming the selected drain select transistors by sequentially applying a pass voltage and a program voltage to the selected drain select line.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure may be implemented in various forms, and may not be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Figure 1:
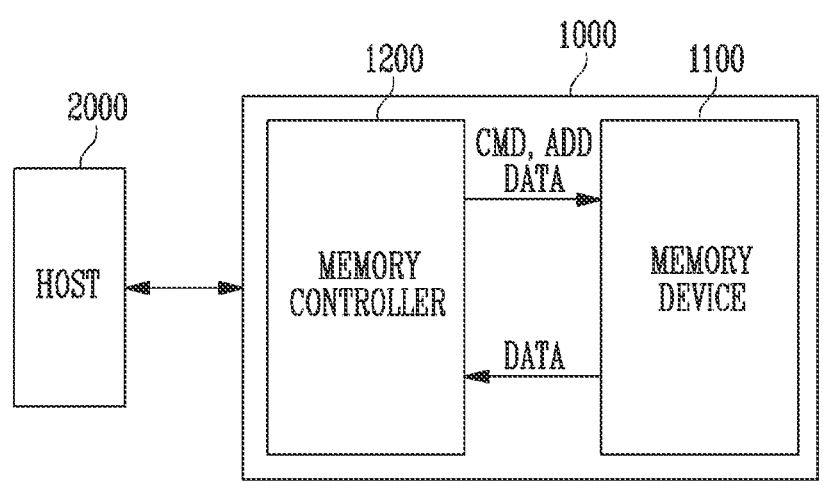
FIG. 1 is a block diagram illustrating a memory system in accordance with an embodiment of the present disclosure.

FIG. 1 is a block diagram illustrating a memory system in accordance with an embodiment of the present disclosure.

Referring to FIG. 1, the memory system 1000 may include a memory device 1100 configured to store data and a memory controller 1200 configured to control the memory device 1100 under the control of a host 2000.

By using an interface protocol such as Peripheral Component Interconnect-Express (PCI-E), Advanced Technology Attachment (ATA), Serial ATA (SATA), Parallel ATA (PATA), or Serial Attached SCSI (SAS), the host 2000 may communicate with the memory system 1000. In addition, the interface protocol between the host 2000 and the memory system 1000 are not limited to the above-described example, and may be one of other interface protocols such as a Universal Serial Bus (USB), a Multi-Media Card (MMC), an Enhanced Small Disk Interface (ESDI), and an Integrated Drive Electronics (IDE).

The memory controller 1200 may control overall operations of the memory system 1000, and control data exchange between the host 2000 and the memory device 1100. For example, the memory controller 1200 may, according to a request of the host 2000, control the memory device 1100 to program or read data. In a program operation, the memory controller 1200 may transmit a command CMD corresponding to the program operation, an address ADD, and data DATA to be programmed to the memory device 1100. Also, in a read operation, the memory controller 1200 may receive and temporarily store data DATA read from the memory device 1100, and transmit the temporarily stored data DATA to the host 2000.

The memory device 1100 may perform a program, read or erase operation under the control of the memory controller 1200.

In some embodiments, the memory device 1100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR), a Rambus Dynamic Random Access Memory (RDRAM), or a flash memory.

Figure 2:
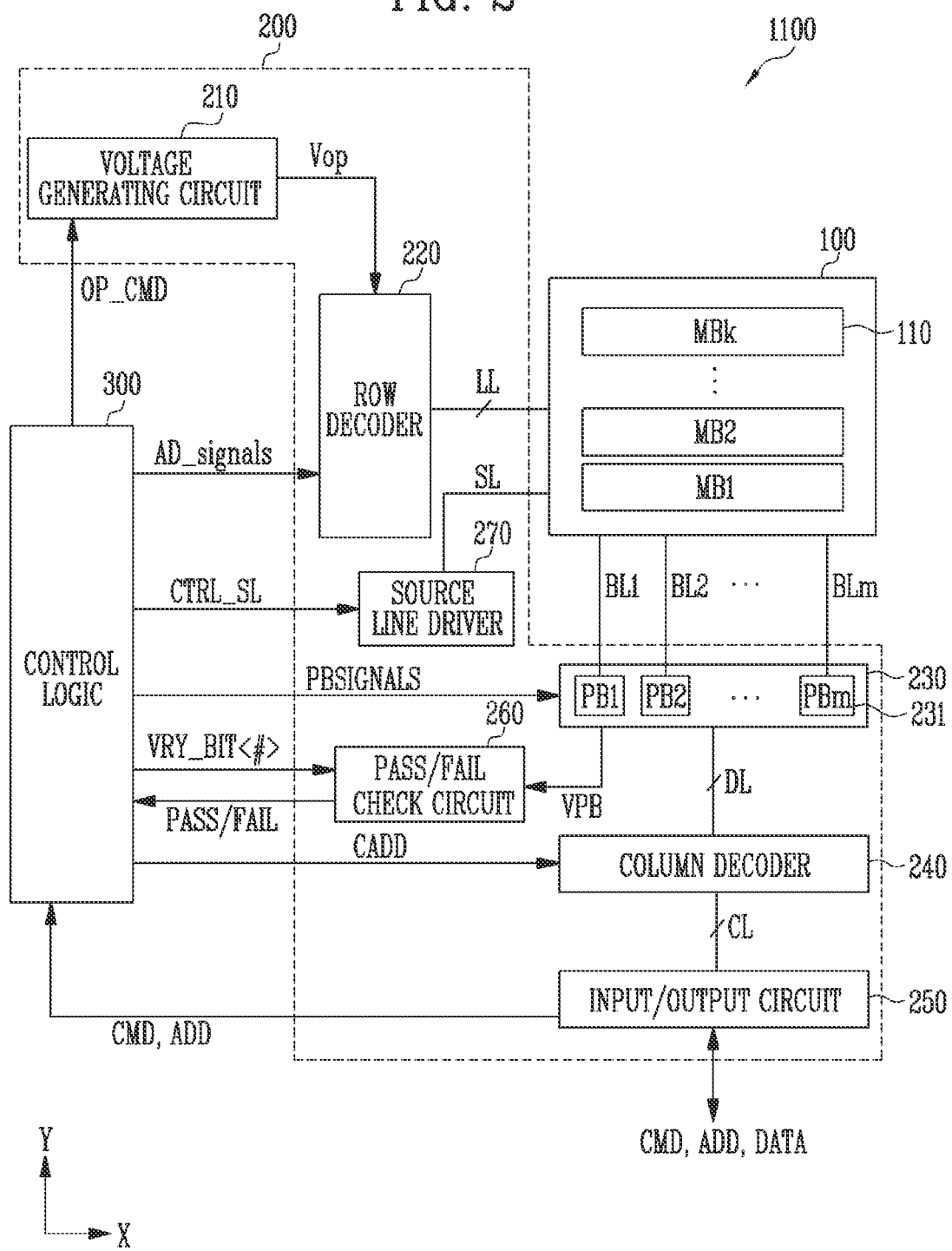
FIG. 2 is a block diagram illustrating a memory device shown in FIG. 1.

FIG. 2 is a block diagram illustrating the memory device shown in FIG. 1.

Referring to FIG. 2, the memory device 1100 may include a memory cell array 100 in which data is stored. The memory device 1100 may include a peripheral circuit 200 configured to perform a program operation for storing data in the memory cell array 100, to perform a read operation for outputting stored data, and to perform an erase operation for erasing stored data. The memory device 1100 may include a control logic 300 which controls the peripheral circuit 200 under the control of the memory controller (1200 shown in FIG. 1).

The memory cell array 100 may include a plurality of memory blocks MB1 to MBk 110 (k is a positive integer), wherein local lines LL and bit lines BL1 to BLm (m is a positive integer) may be connected to each of the memory blocks MB1 to MBk 110. For example, the local lines LL may include a first select line, a second select line, and a plurality of word lines arranged between the first and second select lines. Also, the local lines LL may include dummy lines arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be connected to each of the memory blocks MB1 to MBk 110, and the bit lines BL1 to BLm may be commonly connected to the memory blocks MB1 to MBk 110. The memory blocks MB1 to MBk 110 may be implemented in a two-dimensional or three-dimensional structure. For example, memory cells may be arranged in a direction parallel to a substrate (not shown) in the memory blocks 110 having the two-dimensional structure. For example, memory cells may be stacked in a direction vertical to a substrate (not shown) in the memory blocks 110 having the three-dimensional structure.

Each of the memory blocks MB1 to MBk 110 includes drain select transistors connected to a drain select line. The drain select transistors are connected between the bit lines BL1 to BLm and memory cells, and, in response to an operating voltage applied through the drain select line, may connect the bit lines BL1 to BLm and the memory cells. The drain select transistors may be programmed to have a set threshold voltage value, which may be defined as a program operation of a select transistor.

The peripheral circuit 200 may be configured to perform program, read, and erase operations of a selected memory block 110 under the control of the control logic 300. Also, the peripheral circuit 200 may be configured to perform a select transistor program operation of drain select transistors included in the selected memory block 110.

For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD, and in addition, the voltage generating circuit 210 may selectively discharge the local lines LL in response to the operation signal OP_CMD. For example, the voltage generating circuit 210 may generate a program voltage, a verify voltage, and a pass voltage under the control of the control logic 300.

The row decoder 220 may transfer the operating voltages Vop to the local lines LL connected to the selected memory block 110 in response to row decoder control signals AD_signals. For example, in the select transistor program operation, in response to the row decoder control signals AD_signals, the row decoder 220 may apply the program voltage generated by the voltage generating circuit 210 to a selected drain select line among the local lines LL and apply the pass voltage generated by the voltage generating circuit 210 to word lines. In the select transistor program operation, the row decoder 220 may apply a ground voltage to an unselected drain select line and a source select line.

The page buffer group 230 may include a plurality of page buffers PB1 to PBm 231 connected to the bit lines BL1 to BLm. The page buffers PB1 to PBm 231 may operate in response to page buffer control signals PBSIGNALS. For example, in a program operation, based on the temporarily stored data to be programmed, the page buffers PB1 to PBm 231 may temporarily store data to be programmed and control a potential level of the bit lines BL1 to BLm. Also, in a read or program verify operation, the page buffers PB1 to PBm may sense a voltage or current of the bit lines BL1 to BLm.

In the select transistor program operation, the page buffers PB1 to PBm 231 may apply a first program inhibit voltage or a program allow voltage to corresponding bit lines BL1 to BLm. For example, in the select transistor program operation, the page buffers PB1 to PBm 231 may apply the program allow voltage to a bit line connected to a drain select transistor to be programmed, and may apply the first program inhibit voltage to a bit line connected to a drain select transistor which is not programmed.

In response to a column address CADD, the column decoder 240 may transfer data between the input/output circuit 250 and the page buffer group 230. For example, the column decoder 240 may exchange data with the page buffers 231 through the data lines DL, or exchange data with the input/output circuit 250 through column lines CL.

The input/output circuit 250 may transfer a command CMD and an address ADD, which are transferred from the memory controller (1200 shown in FIG. 1), to the control logic 300, or exchange data DATA with the column decoder 240.

In a read operation or a program verify operation, the pass/fail check circuit 260 may generate a reference current in response to an allow bit VRY_BIT<#>, and by comparing a sensing voltage VPB received from the page buffer group 230 with a reference voltage generated by the reference current, output a pass signal PASS or a fail signal FAIL. Based on a number of memory cells determined as pass in the program verify operation, the sensing voltage VPB may be controlled voltage.

The source line driver 270 may be connected to a memory cell included in the memory cell array 100 through a source line SL, and control a voltage applied to the source line SL. The source line driver 270 may receive a source line control signal CTRL_SL from the control logic 300, and, based on the source line control signal CTRL_SL, control a source line voltage applied to the source line SL.

In the select transistor program operation, the source line driver 270 may apply a coupling voltage to the source line SL. The coupling voltage may be a voltage having a positive potential. The coupling voltage may be a voltage having a potential higher than that of a core power voltage of the memory device 1100. The coupling voltage may be a voltage having a potential higher than that of the first program inhibit voltage. In the select transistor program operation, the coupling voltage may be a voltage for allowing the potential level of the bit lines to be increased by a coupling phenomenon.

In response to a command CMD and an address ADD, the control logic 300 may control the peripheral circuit 200 by outputting the operation signal OP_CMD, the row decoder control signals AD_signals, the page buffer control signals PBSIGNALS, and the allow bit VRY_BIT<#>. In the select transistor program operation, the control logic 300 may control the source line driver 270 to apply the coupling voltage to the source line SL. For example, in the select transistor program operation, the control logic 300 may control the page buffer group 230 to apply the first program inhibit voltage to a bit line connected to a drain select transistor which is not programmed among the bit lines BL1 to BLm and then control the source line driver 270 to apply the coupling voltage to the source line SL. The control logic 300 may control the page buffer group 230 such that the bit lines BL1 to BLm are in a floating state when the coupling voltage is applied to the source line SL. Therefore, in the select transistor program operation, a potential level of the bit line connected to the drain select transistor which is not programmed among the bit line BL1 to BLm is increased to that of the first program inhibit voltage by the page buffer group 230 and then increased to that of a second program inhibit voltage that is higher than the first program inhibit voltage.

Figure 3:
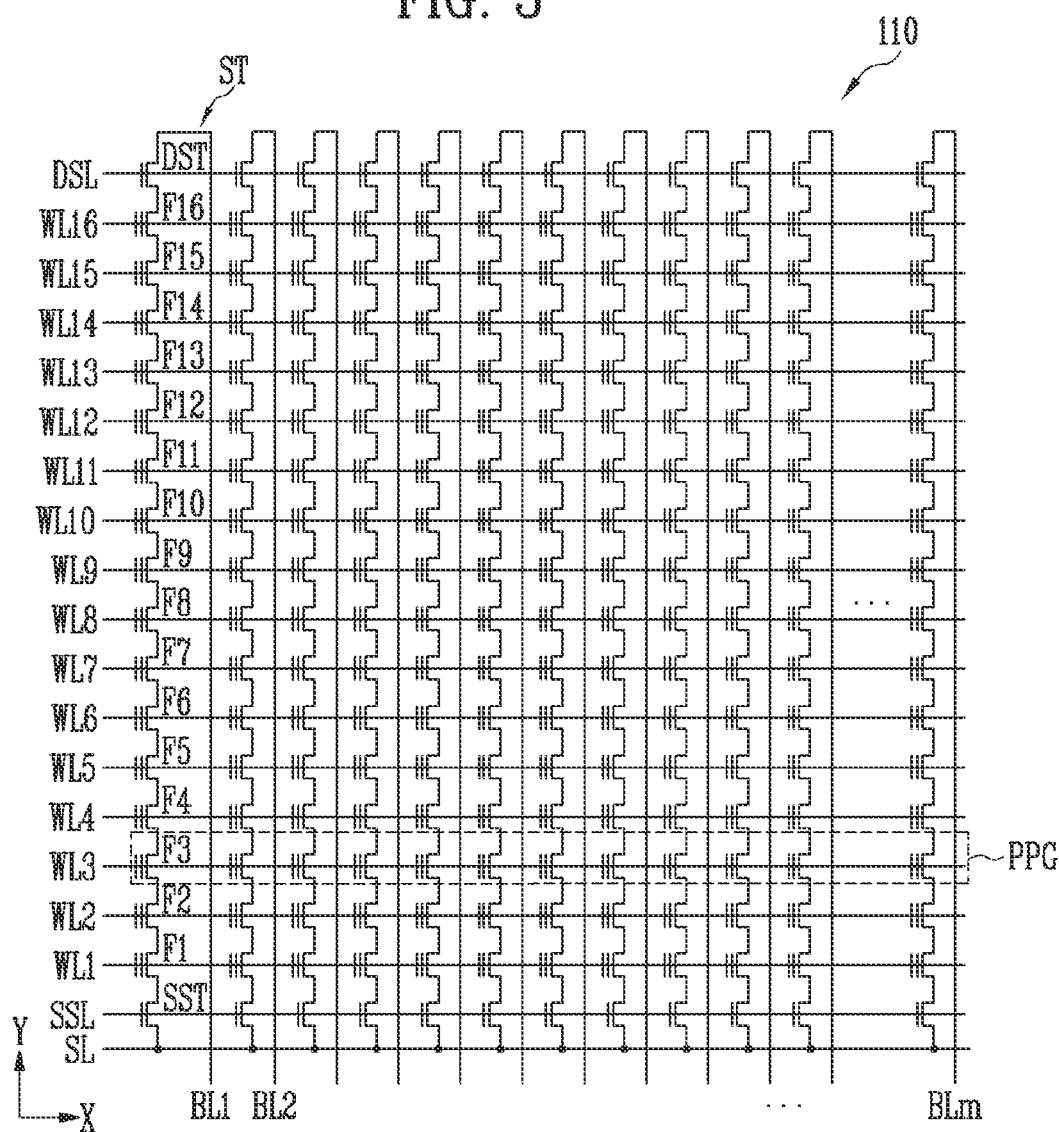
FIG. 3 is a diagram illustrating a memory block shown in FIG. 2.

FIG. 3 is a diagram illustrating the memory block shown in FIG. 2.

Referring to FIG. 3, in the memory block 110, a plurality of word lines arranged in parallel to one another may be connected between a first select line and a second select line. The first select line may be a source select line SSL, and the second select line may be a drain select line DSL. More specifically, the memory block 110 may include a plurality of strings ST connected between bit lines BL1 to BLm and a source line SL. The bit lines BL1 to BLm may be connected to the strings ST, respectively, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series between the source line SL and the first bit line BL1. At least one source select transistor SST and at least one drain select transistor DST may be included in one string ST, and a number of memory cells whose number is greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL. Gates of drain select transistors DST included in different strings ST may be connected to the drain select line DSL, and gates of memory cells F1 to F16 included in different strings ST may be connected to a plurality of word lines WL1 to WL16. A group of memory cells connected to the same word line among memory cells included in different strings ST may be referred as a page PPG. Therefore, pages PPG whose number corresponds to that of the word lines WL1 to WL16 may be included in the memory block 110.

Figure 4:
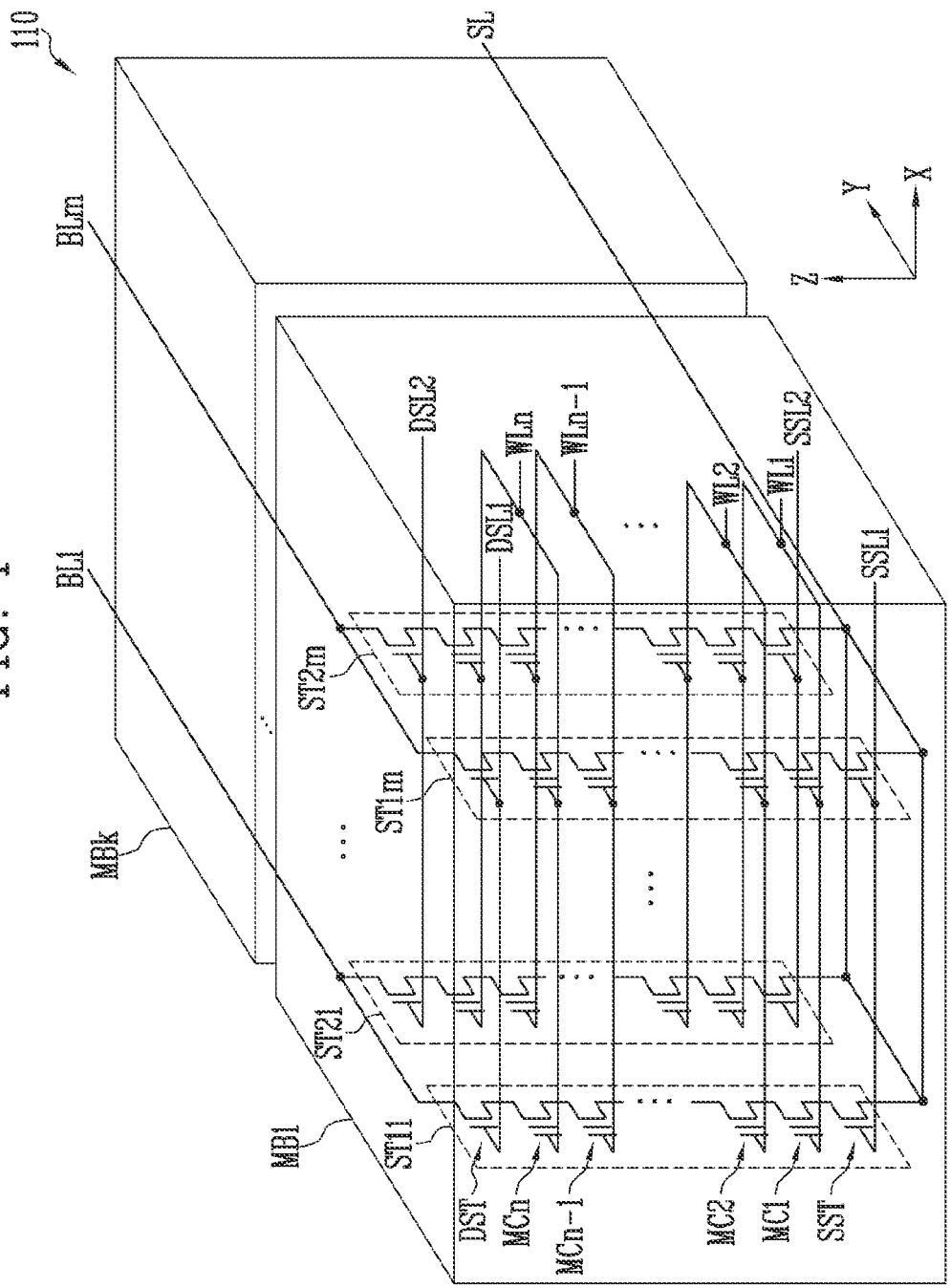
FIG. 4 is a diagram illustrating an embodiment of a three-dimensionally configured memory block.

FIG. 4 is a diagram illustrating an embodiment of a three-dimensionally configured memory block in accordance with the present disclosure.

Referring to FIG. 4, the memory cell array 100 may include a plurality of memory blocks MB1 to MBk 110. The memory block 110 may include a plurality of strings ST11 to ST1*m* and ST21 to ST2*m*. In an embodiment, each of the plurality of strings ST11 to ST1*m* and ST21 to ST2*m* may be formed in an 'I' shape or a 'U' shape. In a first memory block MB1, m strings may be arranged in a row direction (X direction). Although a case where two strings are arranged in a column direction (Y direction) is illustrated in FIG. 4, this is for convenience of description, and three or more strings may be arranged in the column direction (Y direction).

Each of the plurality of strings ST11 to ST1*m* and ST21 to ST2*m* may include at least one source select transistor SST, first to nth memory cells MC1 to MCn, and at least one drain select transistor DST.

The source select transistor SST of each string may be connected between a source line SL and memory cells MC1 to MCn. Source select transistors of strings arranged on the same row may be connected to the same source select line. Source select transistors of strings ST11 to ST1*m* arranged on a first row may be connected to a first source select line SSL1. Source select transistors of strings ST21 to ST2*m* arranged on a second row may be connected to a second source select line SSL2. In another embodiment, the source select transistors of the strings ST11 to ST1*m* and ST21 to ST2*m* may be commonly connected to one source select line.

The first to nth memory cells MC1 to MCn of each string may be connected in series to each other between the source select transistor SST and the drain select transistor DST. Gates of the first to nth memory cells MC1 to MCn may be respectively connected to first to nth word lines WL1 to WLn.

In an embodiment, at least one of the first to nth memory cells MC1 to MCn may be used as a dummy memory cell. When the dummy memory cell is provided, a voltage or current of a corresponding string may be stably controlled. Accordingly, the reliability of data stored in the memory block 110 may be improved.

The drain select transistor DST of each string may be connected between a bit line and the memory cells MC1 to MCn. Drain select transistors DST of strings arranged in the row direction may be connected to a drain select line extending in the row direction. Drain select transistors DST of the strings ST11 to ST1*m* on the first row may be connected to a first drain select line DSL1. Drain select transistors DST of the strings ST21 to ST2*m* on the second row may be connected to a second drain select line DSL2.

Figure 5:
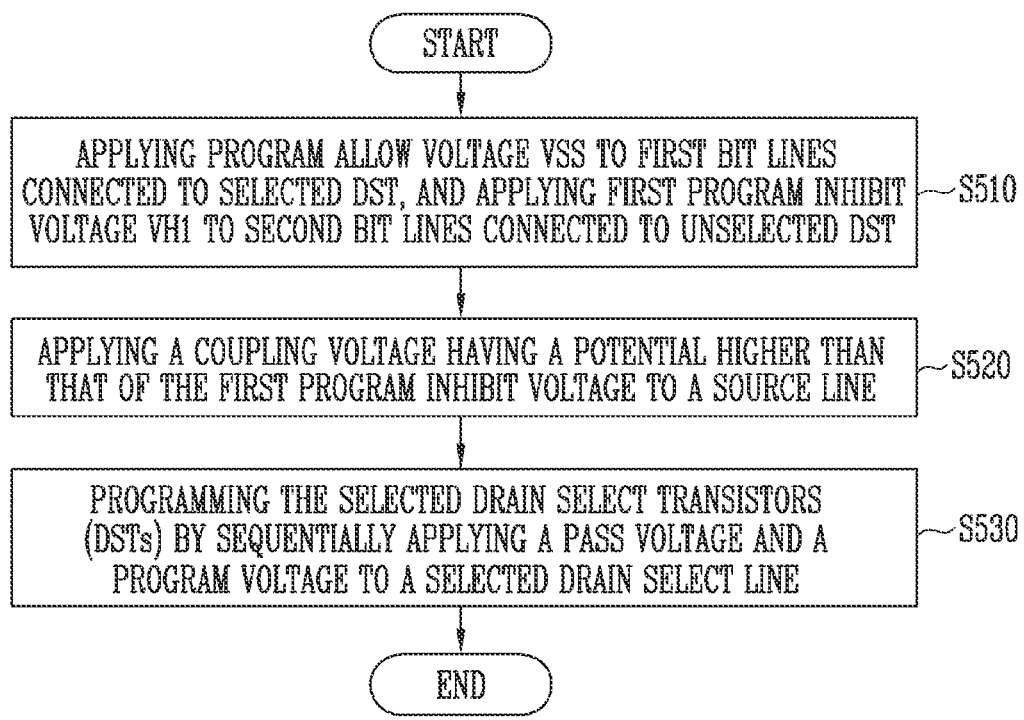
FIG. 5 is a flowchart illustrating a select transistor program operation of the memory device in accordance with an embodiment of the present disclosure.

FIG. 5 is a flowchart illustrating a select transistor program operation of the memory device in accordance with an embodiment of the present disclosure.

Figure 6:
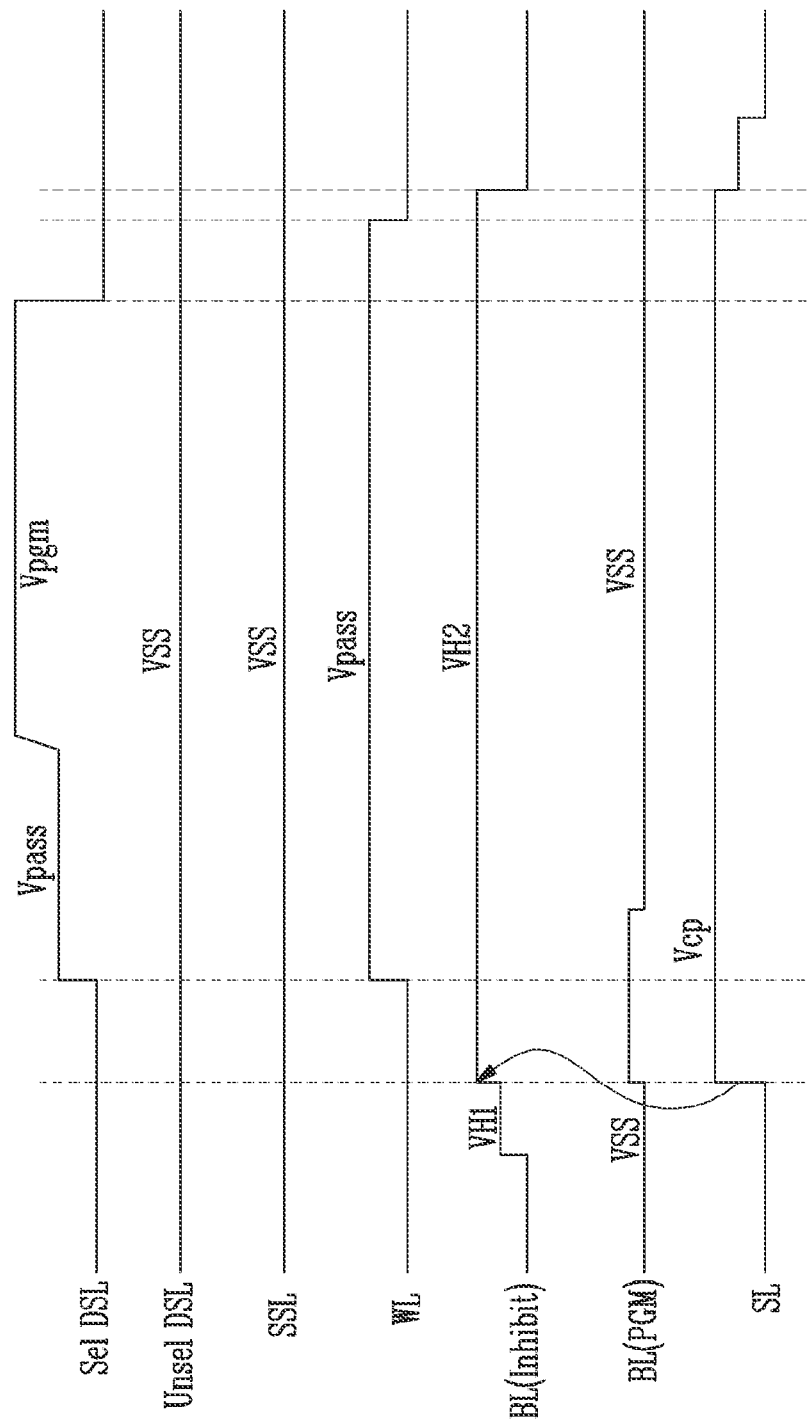
FIG. 6 is a waveform diagram of signals, illustrating the select transistor program operation in accordance with an embodiment of the present disclosure.

FIG. 6 is a waveform diagram of signals, illustrating the select transistor program operation in accordance with an embodiment of the present disclosure.

A method for performing the select transistor program operation of the memory device in accordance with an embodiment of the present disclosure will be described as follows with reference to FIGS. 2 to 6.

In step S510, the page buffers PB1 to PBm 231 apply a program allow voltage (e.g., VSS) to first bit lines BL(PGM) connected to selected drain select transistors DST on which a program operation is to be performed among drain select transistors DST included in a selected memory block (e.g., MB1) for a certain time under the control of the control logic 300. Also, the page buffers PB1 to PBm 231 apply a first program inhibit voltage VH1 to second bit lines BL(Inhibit) connected to unselected drain select transistors DST on which the program operation is not performed among the drain select transistors DST that are included in the selected memory block (e.g., MB1) for a certain time under the control of the control logic 300. The first program inhibit voltage VH1 may be a core power voltage of the memory device 1100. Therefore, the second bit lines BL(Inhibit) may be charged to a level of the first program inhibit voltage VH1.

The page buffers PB1 to PBm 231 apply the program allow voltage VSS or the first program inhibit voltage VH1 to bit lines BL1 to BLm of the selected memory block (e.g., MB1) for a certain time and then control the bit lines BL1 to BLm to be in a floating state.

In step S520, the source line driver 270 may apply a coupling voltage Vcp to a source line SL under the control of the control logic 300. The coupling voltage Vcp may be a voltage having a potential higher than that of the first program inhibit voltage VH1. The coupling voltage Vcp may be a voltage having a potential higher than that of the core power voltage. Therefore, the second bit lines BL(Inhibit) controlled to be in the floating state after the second bit lines BL(Inhibit) are charged to the level of the first program inhibit voltage VH1 may be increased to a voltage of a second program inhibit voltage VH2 due to a coupling phenomenon caused by the coupling voltage Vcp applied to the source line SL. The second program inhibit voltage VH2 has a potential higher than that of the first program inhibit voltage VH1.

A potential of the first bit lines BL(PGM) controlled to be in the floating state after the first bit lines BL(PGM) are charged to a level of the program allow voltage VSS may be increased to a certain level due to the coupling phenomenon caused by the coupling voltage Vcp applied to the source line SL.

In step S530, the voltage generating circuit 210 generates and outputs a pass voltage Vpass and a program voltage Vpgm under the control of the control logic 300, and the row decoder 220 sequentially applies the pass voltage Vpass and program voltage Vpgm, which are generated by the voltage generating circuit 210, to a selected drain select line Sel DSL of the selected memory block MB1.

For example, the row decoder 220 applies the pass voltage Vpass generated by the voltage generating circuit 210 to the selected drain select line Sel DSL and word lines WL (WL1 to WLn), and programs drain select transistors connected to the first bit lines BL(PGM) among drain select transistors DST connected to the selected drain select line Sel DSL by applying the program voltage Vpgm generated by the voltage generating circuit 210 to the selected drain select line Sel DSL after a certain time.

In a partial period during a period in which the pass voltage Vpass is applied to the selected drain select line Sel DSL, by applying the program allow voltage VSS to the first bit line BL(PGM) for a certain time, the page buffers PB1 to PBm 231 may control the potential of the first bit lines BL(PGM) to have the level of the program allow voltage VSS. The page buffers PB1 to PBm 231 may apply the first program inhibit voltage VH1 to the second bit lines BL(Inhibit), but the second bit lines BL(Inhibit) maintain the level of the second program inhibit voltage VH2.

While the program voltage Vpgm is applied to the selected drain select line Sel DSL, the second bit lines BL(Inhibit) may maintain the level of the second program inhibit voltage VH2 having a potential higher than that of the first program inhibit voltage VH1. Thus, a threshold voltage of drain select transistors DST connected to the second bit lines BL(Inhibit), on which the program operation is not performed, among the drain select transistors DST connected to the selected drain select line Sel DSL is suppressed from increasing.

Subsequently, the row decoder 220 discharges the selected drain select line Sel DSL to which the program voltage Vpgm has been applied to a ground level, and discharges the word lines WL1 to WLn to which the pass voltage Vpass has been applied to the ground level. Subsequently, the source driver 270 discharges the source line to which the coupling voltage Vcp has been applied to the ground level. A potential level of the source line SL may be discharged in a plurality of steps.

In the select transistor program operation, the row decoder 220 may apply a ground voltage VSS to an unselected drain select line Unsel DSL and a source select line SSL.

Figure 7:
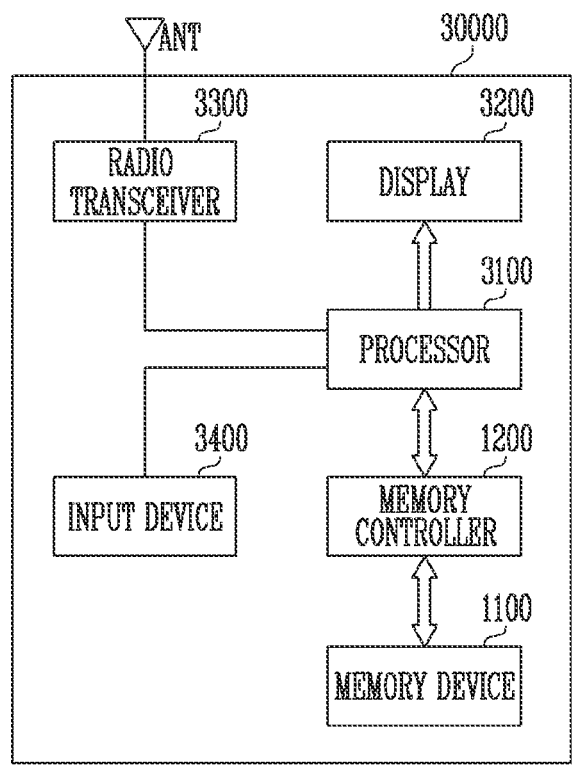
FIG. 7 is a block diagram illustrating another embodiment of the memory system of the present disclosure.

FIG. 7 is a block diagram illustrating another embodiment of the memory system in accordance with the present disclosure.

Referring to FIG. 7, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may change a radio signal received through the antenna ANT into a signal that may be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and may output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the memory controller 1200, data output from the radio transceiver 3300, or data output from the input device 3400 may be output through the display 3200.

In some embodiments, the memory controller 1200 capable of controlling an operation of the memory device 1100 may be implemented as a part of the processor 3100, or may be implemented as a chip separate from the processor 3100. Also, the memory controller 1200 may be implemented with the memory controller 1200 shown in FIG. 1, and the memory device 1100 may be implemented with the memory device 1100 shown in FIG. 2.

Figure 8:
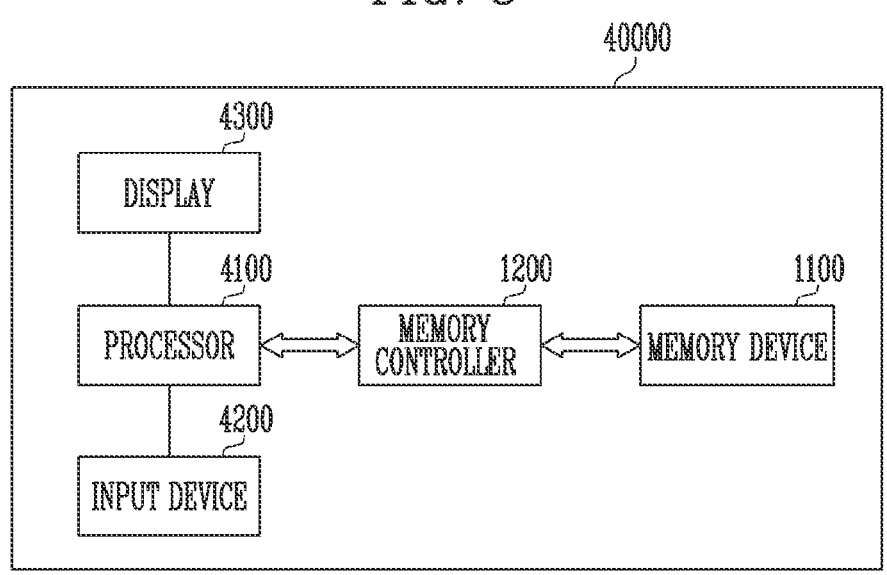
FIG. 8 is a block diagram illustrating another embodiment of the memory system of the present disclosure.

FIG. 8 is a block diagram illustrating another embodiment of the memory system in accordance with the present disclosure.

Referring to FIG. 8, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may, according to data input through an input device 4200, output data stored in the memory device 1100 through a display 4300. For example, the input device 4200 may be implemented as a pointing device such as a touch pad or a computer mouse, a keypad, or a keyboard.

The processor 4100 may control overall operations of the memory system 40000, and may control an operation of the memory controller 1200. In some embodiments, the memory controller 1200 capable of controlling an operation of the memory device 1100 may be implemented as a part of the processor 4100, or may be implemented as a chip separate from the processor 4100. Also, the memory controller 1200 may be implemented with the memory controller 1200 shown in FIG. 1, and the memory device 1100 may be implemented with the memory device 1100 shown in FIG. 2.

Figure 9:
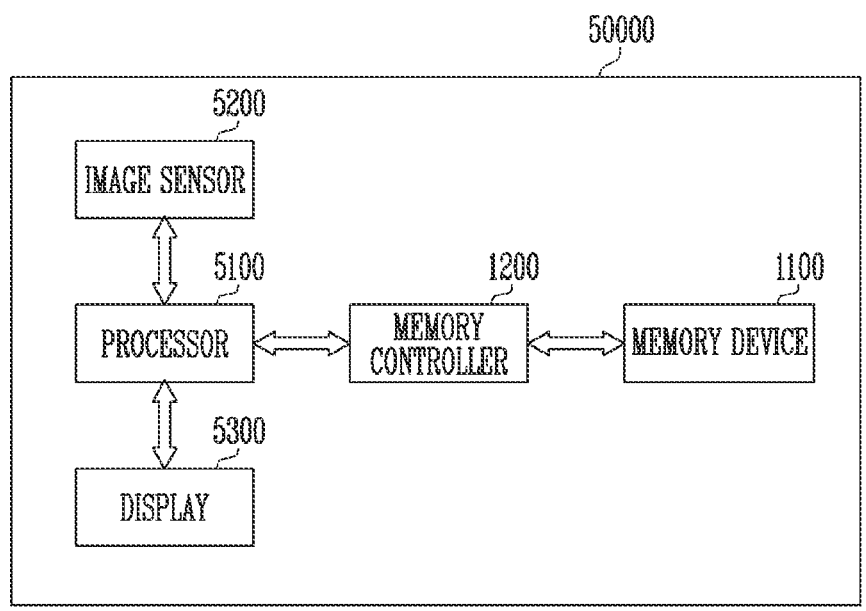
FIG. 9 is a block diagram illustrating another embodiment of the memory system of the present disclosure.

FIG. 9 is a block diagram illustrating another embodiment of the memory system in accordance with the present disclosure.

Referring to FIG. 9, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or may be stored in the memory device 1100 through the memory controller 1200. In addition, under the control of the processor 5100 or the memory controller 1200, data stored in the memory device 1100 may be output through the display 5300.

In some embodiments, the memory controller 1200 capable of controlling an operation of the memory device 1100 may be implemented as a part of the processor 5100, or may be implemented as a chip separate from the processor 5100. Also, the memory controller 1200 may be implemented with the memory controller 1200 shown in FIG. 1, and the memory device 1100 may be implemented with the memory device 1100 shown in FIG. 2.

Figure 10:
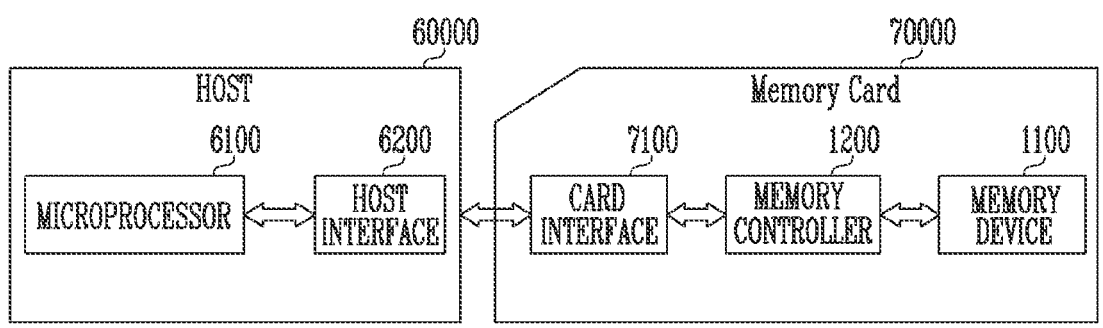
FIG. 10 is a block diagram illustrating another embodiment of the memory system of the present disclosure.

FIG. 10 is a block diagram illustrating another embodiment of a memory system in accordance with the present disclosure.

Referring to FIG. 10, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the memory controller 1200 may be implemented with the memory controller 1200 shown in FIG. 1, and the memory device 1100 may be implemented with the memory device 1100 shown in FIG. 2.

According to a protocol of the host 60000, the card interface 7100 may interface data exchange between a host 60000 and the memory controller 1200. In some embodiments, the card interface 7100 may support a universal serial bus (USB) protocol and an inter-chip (IC)-USB protocol. The card interface 7100 may be hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with the present disclosure, a threshold voltage of an unselected select transistor is suppressed from increasing in a program operation of a select transistor, so that the width of a threshold voltage distribution of select transistors may be improved.

In an embodiment of the present disclosure, a memory device may include a memory block, a peripheral circuit, and a control logic. The memory block may include a plurality of memory cells and a plurality of drain select transistors connected to a selected drain select line. The peripheral circuit may be configured to perform a program operation on selected drain select transistors among the plurality of drain select transistors, and the control logic may be configured to control the peripheral circuit to perform the program operation on the selected drain select transistors. The peripheral circuit may apply a coupling voltage having a positive potential higher than that of unselected drain select transistors to a source line, and may program the selected drain select transistors by sequentially applying a pass voltage and a program voltage to the selected drain select line.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims, but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications may be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications may be made on the basis of the technological scope of the present disclosure in addition to the embodiments disclosed herein.

What is claimed is:

1. A memory device comprising:
    a memory block including a plurality of memory cells and a plurality of select transistors;
    a peripheral circuit configured to perform a program operation on selected select transistors among the plurality of select transistors in a select transistor program operation; and
    a control logic configured to control the peripheral circuit to perform the select transistor program operation,
    wherein the peripheral circuit applies a coupling voltage having a positive potential to a source line of the memory block in the select transistor program operation.

2. The memory device of claim 1, wherein the select transistors are drain select transistors connected to bit lines.

3. The memory device of claim 2, wherein the peripheral circuit includes:
    a voltage generating circuit configured to generate a pass voltage and a program voltage;
    a row decoder configured to apply the pass voltage and the program voltage, which are generated by the voltage generating circuit, to select lines and word lines of the memory block;
    a page buffer group connected to the bit lines, the page buffer group applying a program allow voltage to first bit lines connected to selected drain select transistors on which the program operation is to be performed among the bit lines and applying a first program inhibit voltage to second bit lines connected to unselected drain select transistors on which the program operation is not performed among the bit lines in the select transistor program operation; and
    a source line driver configured to apply the coupling voltage to the source line in the select transistor program operation.

4. The memory device of claim 3, wherein the row decoder sequentially applies the pass voltage and the program voltage to a selected drain select line among the select lines.

5. The memory device of claim 4, wherein the page buffer group applies the program allow voltage to the first bit lines and applies the first program inhibit voltage to the second bit lines, before the pass voltage is applied to the selected drain select line.

6. The memory device of claim 5, wherein the page buffer group applies the program allow voltage and the first program inhibit voltage respectively to the first bit lines and the second bit lines and then controls the first bit lines and the second bit lines to be in a floating state.

7. The memory device of claim 6, wherein the source line driver applies the coupling voltage to the source line from a period in which the first bit lines and the second bit lines are in the floating state.

8. The memory device of claim 7, wherein a potential level of the second bit lines in the floating state is increased to a voltage of a second program inhibit voltage having a potential higher than that of the first program inhibit voltage due to a coupling phenomenon caused by the coupling voltage applied to the source line.

9. The memory device of claim 8, wherein the page buffer group controls a potential of the first bit lines to have a level of the program allow voltage by applying the program allow voltage to the first bit lines in the floating state for a certain time in a period in which the pass voltage is applied to the selected drain select line.

10. A memory device comprising:
   a memory block including a plurality of memory cells and a plurality of drain select transistors;
   a peripheral circuit configured to perform a program operation on selected drain select transistors among the plurality of drain select transistors in a select transistor program operation; and
   a control logic configured to control the peripheral circuit to perform the select transistor program operation,
   wherein the peripheral circuit applies a coupling voltage having a positive potential to a source line of the memory block in the select transistor program operation, and
   wherein a potential level of second bit lines connected to unselected drain select transistors among the plurality of drain select transistors is increased due to a coupling phenomenon caused by the coupling voltage.

11. The memory device of claim 10, wherein the peripheral circuit includes:
   a voltage generating circuit configured to generate a pass voltage and a program voltage;
   a row decoder configured to apply the pass voltage and the program voltage, which are generated by the voltage generating circuit, to select lines and word lines of the memory block;
   a page buffer group connected to the bit lines of the memory block, the page buffer group applying a program allow voltage to first bit lines connected to the selected drain select transistors on which the program operation is to be performed among the bit lines and applying a first program inhibit voltage to the second bit lines connected to the unselected drain select transistors on which the program operation is not performed among the bit lines in the select transistor program operation; and
   a source line driver configured to apply the coupling voltage to the source line in the select transistor program operation.

12. The memory device of claim 11, wherein the row decoder sequentially applies the pass voltage and the program voltage to a selected drain select line among the select lines.

13. The memory device of claim 12, wherein the page buffer group applies the program allow voltage to the first bit lines and applies the first program inhibit voltage to the second bit lines for a certain time, before the pass voltage is applied to the selected drain select line, and then controls the first bit lines and the second bit lines to be in a floating state.

14. The memory device of claim 13, wherein the source line driver applies the coupling voltage having a potential higher than that of the first program inhibit voltage to the source line from a period in which the first bit lines and the second bit lines are in the floating state.

15. The memory device of claim 14, wherein the page buffer group controls a potential of the first bit lines to have a level of the program allow voltage by applying the program allow voltage to the first bit lines in the floating state for a certain time in a period in which the pass voltage is applied to the selected drain select line.

16. A method for operating a memory device, the method comprising:
   applying a program allow voltage to first bit lines connected to selected drain select transistors on which a program operation is to be performed among a plurality of drain select transistors connected to a selected drain select line, and applying a first program inhibit voltage to second bit lines connected to unselected drain select transistors among the plurality of drain select transistors;
   applying a coupling voltage having a potential higher than that of the first program inhibit voltage to a source line; and
   programming the selected drain select transistors by sequentially applying a pass voltage and a program voltage to the selected drain select line.

17. The method of claim 16, wherein, in the applying of the coupling voltage to the source line, the first bit lines and the second bit lines are controlled to be in a floating state.

18. The method of claim 17, wherein a potential level of the second bit lines in the floating state is increased due to a coupling phenomenon caused by the coupling voltage applied to the source line.

19. The method of claim 18, wherein the coupling voltage has a potential level higher than that of the first program inhibit voltage.

20. The method of claim 16, wherein the program allow voltage is applied to the first bit lines for a certain time in a period in which the pass voltage is applied to the selected drain select line.

* * * * *